(12) United States Patent
Tsang

(10) Patent No.: US 7,679,538 B2
(45) Date of Patent: Mar. 16, 2010

(54) CURRENT-STEERING TYPE DIGITAL-TO-ANALOG CONVERTER

(76) Inventor: Robin M. Tsang, 6805 Wood Hollow, Apt. 313, Austin, TX (US) 78731

( * ) Notice: Subject to any disclaimer, the term of this patent is extended or adjusted under 35 U.S.C. 154(b) by 0 days.

(21) Appl. No.: 12/063,397

(22) PCT Filed: Aug. 10, 2006

(86) PCT No.: PCT/US2006/031248

§ 371 (c)(1),
(2), (4) Date: Feb. 8, 2008

(87) PCT Pub. No.: WO2007/021863

PCT Pub. Date: Feb. 22, 2007

(65) Prior Publication Data

US 2008/0198053 A1  Aug. 21, 2008

Related U.S. Application Data

(60) Provisional application No. 60/707,702, filed on Aug. 12, 2005.

(51) Int. Cl.
*H03M 1/66* (2006.01)
(52) U.S. Cl. .................. 341/144; 341/136; 341/141; 341/145; 341/153
(58) Field of Classification Search ......... 341/144–154, 341/136, 141
See application file for complete search history.

(56) References Cited

U.S. PATENT DOCUMENTS

| | | | | |
|---|---|---|---|---|
| 4,591,832 A | * | 5/1986 | Fling et al. | 341/141 |
| 4,833,473 A | * | 5/1989 | Dingwall | 341/154 |
| 5,412,387 A | * | 5/1995 | Vincelette et al. | 341/150 |
| 5,689,259 A | * | 11/1997 | Ozguc | 341/144 |
| 6,252,567 B1 | * | 6/2001 | Budzelaar | 345/55 |
| 6,639,534 B2 | * | 10/2003 | Khoini-Poorfard et al. | 341/144 |
| 6,823,416 B1 | * | 11/2004 | Dempsey et al. | 710/305 |
| 6,977,602 B1 | * | 12/2005 | Ostrem et al. | 341/145 |
| 7,075,847 B2 | * | 7/2006 | Kim et al. | 365/222 |
| 7,098,830 B2 | * | 8/2006 | Lin et al. | 341/144 |
| 7,312,737 B2 | * | 12/2007 | Jungerman et al. | 341/141 |
| 7,576,675 B1 | * | 8/2009 | Lee et al. | 341/144 |
| 2002/0030621 A1 | * | 3/2002 | Okada et al. | 341/153 |
| 2008/0266156 A1 | * | 10/2008 | Bruin | 341/146 |

\* cited by examiner

*Primary Examiner*—Linh V Nguyen
(74) *Attorney, Agent, or Firm*—Antony P. Ng; Dillon & Yudell LLP

(57) ABSTRACT

A current-steering type digital-to-analog converter (DAC) is disclosed. The DAC includes a first sub-DAC, a second sub-DAC and a controlling device. Both the first sub-DAC and the second sub-DAC are configured to receive input signals. The controlling device selectively and periodically sends output signals of either the first sub-DAC or the second sub-DAC to a resistive load while sending output signals of the remaining one of the two sub-DACs to a dummy resistive load. An output of the DAC is provided at the resistive load.

19 Claims, 3 Drawing Sheets

| CYCLE | 1 | 2 | 3 | 4 | 5 |
|---|---|---|---|---|---|
| sub-DAC 11 | 7 | ⑦ | 5 | ⑤ | 9 |
| sub-DAC 12 | X | 3 | ③ | 2 | ② |

US 7,679,538 B2

CURRENT-STEERING TYPE DIGITAL-TO-ANALOG CONVERTER

RELATED PATENT APPLICATION

The present patent application claims priority to copending provisional application U.S. Ser. No. 60/707,702, filed on Aug. 12, 2005.

BACKGROUND OF THE INVENTION

1. Technical Field

The present invention relates to mixed-signal circuits in general, and in particular to digital-to-analog converters. Still more particularly, the present invention relates to a current-steering type digital-to-analog converter.

2. Description of Related Art

Digital-to-analog converters (DACs) are electronic circuits for converting signals from a digital domain, where signals are typically represented by discrete quantities, to an analog domain, where signals are typically represented by continuous quantities. Well-known DAC types include resistor-string, charge-redistribution, and current-steering.

Any of the above-mentioned DAC types may use a binary-weighted design, a thermometer-code design, or a combination of both designs to convert a digital signal to an analog signal. With a binary-weighted design, analog signals are generated from an array of binary-weighted elements that can be capacitors, resistors, or current sources. The advantage of a binary-weighted design is compactness. With a thermometer-code design, analog signals are generated from an array of unit elements that can be capacitors, resistors, or current sources. Advantages of a thermometer-code design include monotonic input-output transfer characteristic and reduced glitch energy during switching transients.

For current-steering type DACs, it is often a sensible choice to have the most-significant bits (MSBs) implemented with the thermometer-code design, while the least-significant bits implemented with the binary-weighted design. The combination of the two designs is a tradeoff between implementation cost (such as chip size) and performance (such as improved monotonicity and reduced glitch energy).

One problem with conventional current-steering type DACs is that their internal bias points are often forced to change to accommodate output values during switching transients from one value to the next. Each time an internal bias point, such as the common-source node of the current-steering transistors, changes due to a change in the DAC's output value, parasitic capacitors associated with the internal bias node need If such charging or discharging affects the output signal in a non-linear way, the dynamic performance of the DAC will be compromised. Consequently, it is desirable to provide an improved current-steering type DAC.

SUMMARY OF THE INVENTION

In accordance with a preferred embodiment of the present invention, a digital-to-analog converter (DAC) includes a first sub-DAC, a second sub-DAC and a controlling device. Both the first sub-DAC and the second sub-DAC are configured to receive input signals. The controlling device selectively and periodically sends output signals of either the first sub-DAC or the second sub-DAC to a resistive load while sending output signals of the remaining one of the two sub-DACs to a dummy resistive load. An output of the DAC is provided at the resistive load.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figures 1, 2:
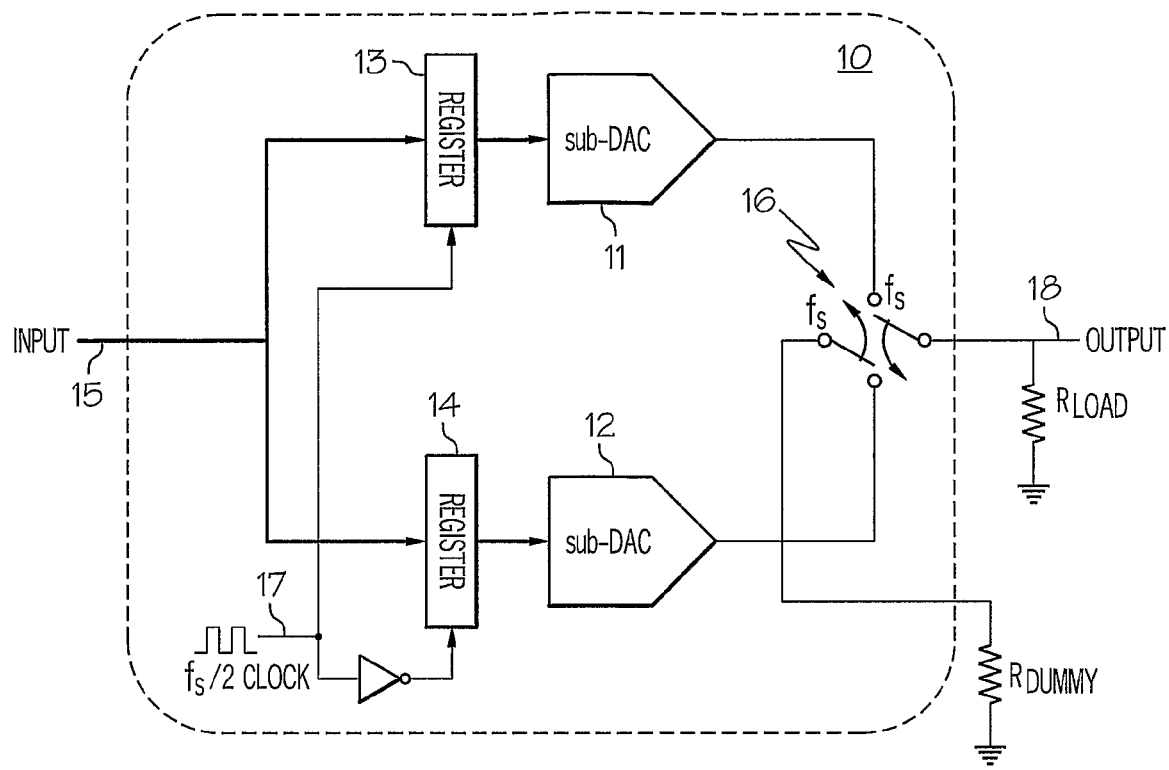
FIG. 1 is a block diagram of a digital-to-analog converter, in accordance with a preferred embodiment of the present invention.
FIG. 2 is an output example of the digital-to-analog converter from FIG. 1, in accordance with a preferred embodiment of the present invention.

Referring now to the drawings and in particular to FIG. 1, there is depicted a block diagram of a digital-to-analog converter (DAC), in accordance with a preferred embodiment of the present invention. As shown, a DAC 10 includes a sub-DAC 11 and a sub-DAC 12 connected in parallel. Preferably, both sub-DAC 11 and sub-DAC 12 are current-steering type DACs that are substantially identical to each other. The inputs of sub-DAC 11 and sub-DAC 12 are coupled to an input 15 via a register 13 and a register 14, respectively, that latch data values from input 15. At the rising or falling edge of a clock signal 17 that feeds register 13 and 14, data values from input 15 are stored into, and transferred to the outputs of registers 13 and 14, respectively. The output of sub-DAC 11 and the output of sub-DAC 12 can be selectively connected to a load resistor $R_{load}$ or a dummy load resistor $R_{dummy}$ via a switch 16.

For the sake of simplicity, only one switch 16 is depicted in FIG. 1 for the purpose of illustrating the present invention, it is understood by those skilled in the art that, for current-steering type DACs, each of sub-DAC 11 and sub-DAC 12 has many outputs, and switch 16 represents a group of switches that are capable of simultaneously connecting all the outputs of one of sub-DACs 11-12 to load resistor $R_{load}$ while simultaneously connecting all the outputs of the remaining one of sub-DACs 11-12 to dummy load resistor $R_{dummy}$. For example, each of sub-DAC 11 and sub-DAC 12 has n outputs, and switch 16 is capable of simultaneously connecting all n outputs of sub-DAC 11 to load resistor $R_{load}$ while simultaneously connecting all n outputs of sub-DAC 12 to dummy load resistor $R_{dummy}$, and vice versa. Similarly, for the sake of simplicity, each of sub-DACs 11 and 12 is shown to have a single-ended mode in FIG. 1; however, in practice, each of sub-DACs 11 and 12 are preferably implemented in differential mode such that two load resistors and two dummy load resistors are connected to the output of DAC 10.

The connections of the outputs of sub-DAC 11 and sub-DAC 12 to either load resistor $R_{load}$ or dummy load resistor $R_{dummy}$ are orthogonal to each other. In other words, if the output of sub-DAC 11 is connected to load resistor $R_{load}$, then the output of sub-DAC 12 is connected to dummy load resistor $R_{dummy}$; and conversely, if the output of sub-DAC 11 is connected to dummy load resistor $R_{dummy}$, then the output of sub-DAC 12 is connected to load resistor $R_{load}$. Preferably, load resistor $R_{load}$ and dummy load resistor $R_{dummy}$ have identical resistance value.

If the sampling frequency of input data at input 15 is $f_s$, then switch 16 switches at the sampling frequency $f_s$ while sub-DACs 11-12 and registers 13-14 operates at half the sampling frequency $f_s$, i.e., $f_s/2$. Accordingly, an output 18 of DAC 10 is switched at the sampling frequency $f_s$ between sub-DACs 11 and 12.

One problem with prior art current-steering type DACs is that their internal bias points are often forced to change to accommodate output values during switching transients from one value to the next. Each time an internal bias point changes due to a change in the output value of a DAC, parasitic capacitors associated with the internal bias node needs to be charged or discharged accordingly. If such charging or discharging affects the output signal in a non-linear manner, the dynamic performance of the DAC will be compromised.

Thus, in accordance with a preferred embodiment of the present invention, the settings of internal bias points of sub-DAC 11 and sub-DAC 12 are handled by using a series of active-idle cycles (i.e., an active cycle followed by an idle cycle). During operation, each of sub-DAC 11 and sub-DAC 12 alternates through a series of active-idle cycles. The active-idle cycles of sub-DAC 11 and sub-DAC 12 are orthogonal (or opposite) to each other. In other words, if sub-DAC 11 is in an active cycle, then sub-DAC 12 is in an idle cycle, and vice versa. Each of sub-DAC 11 and sub-DAC 12 takes turns to drive load resistor $R_{load}$ during its active cycle. When one of sub-DAC 11 and sub-DAC 12 is driving load resistor $R_{load}$ during its active cycle, the other one of sub-DAC 11 and sub-DAC 12 drives dummy load resistor $R_{dummy}$ during its idle cycle. As a result, output signals of one of sub-DACs 11-12 can be selectively and periodically sent to load resistor $R_{load}$ while output signals of the remaining one of sub-DACs 11-12 are sent to dummy load resistor $R_{dummy}$ such that its internal bias points can be set.

Each of sub-DACs 11 and 12 uses the same latched data value from registers 13 and 14, respectively, during both idle and active cycles. For example, the input value of sub-DAC 11 during its idle cycle remains as the input value of sub-DAC 11 during its active cycle. This allows sub-DAC 11 to set its internal bias points to the correct level using dummy load resistor $R_{dummy}$ during its idle cycle. In other words, if sub-DAC 11 needs to output a particular value during its active cycle, sub-DAC 11 will use its idle cycle to drive dummy load resistor $R_{dummy}$ so its internal bias points can be set before its active cycle.

With the alternating active and idle cycles, the internal bias points of sub-DAC 11 and sub-DAC 12 are always optimally set during their idle cycles, the parasitic capacitance associated with the internal bias points do not need to be charged or discharged during their active cycles. As a result, DAC 10 can reach maximum dynamic linearity throughout the entire operation.

With reference now to FIG. 2, there is illustrated an output example of DAC 10 from FIG. 1, in accordance with a preferred embodiment of the present invention. As shown, the circled numerical value denotes the output value of DAC 10. Cycle 1 is an initiation cycle in which sub-DAC 11 is connected to dummy load resistor $R_{dummy}$ such that its internal nodes can be charged to a correct level (in the present example, a value "7" is the output to dummy load resistor $R_{dummy}$). During cycle 1, sub-DAC 12 is connected to load resistor $R_{load}$, but its output value is irrelevant. During cycle 2, sub-DAC 11 is connected to load resistor $R_{load}$, to output a value "7" at output 18 while sub-DAC 12 is connected to dummy load resistor $R_{dummy}$ such that its internal nodes can be charged to a correct level (in the present example, a value "3" is the output to dummy load resistor $R_{dummy}$). During cycle 3, sub-DAC 12 is connected to load resistor $R_{load}$ to output a value "3" at output 18 while sub-DAC 11 is connected to dummy load resistor $R_{dummy}$ such that its internal nodes can be charged to a correct level (in the present example, a value "5" is the output to dummy load resistor $R_{dummy}$).

During cycle 3, sub-DAC 12 is connected to load resistor $R_{load}$ to output a value "3" at output 18 while sub-DAC 11 is connected to dummy load resistor $R_{dummy}$ such that its internal nodes can be charged to a correct level (in the present example, a value "5" is the output to dummy load resistor $R_{dummy}$). During cycle 4, sub-DAC 11 is connected to load resistor $R_{load}$ to output a value "5" at output 18 while sub-DAC 12 is connected to dummy load resistor $R_{dummy}$ such that its internal nodes can be charged to a correct level (in the present example, a value "2" is the output to dummy load resistor $R_{dummy}$). During cycle 5, sub-DAC 12 is connected to load resistor $R_{load}$ to output a value "2" at output 18 while sub-DAC 11 is connected to dummy load resistor $R_{dummy}$ such that its internal nodes can be charged to a correct level (in the present example, a value "9" is the output to dummy load resistor $R_{dummy}$).

Figure 3:
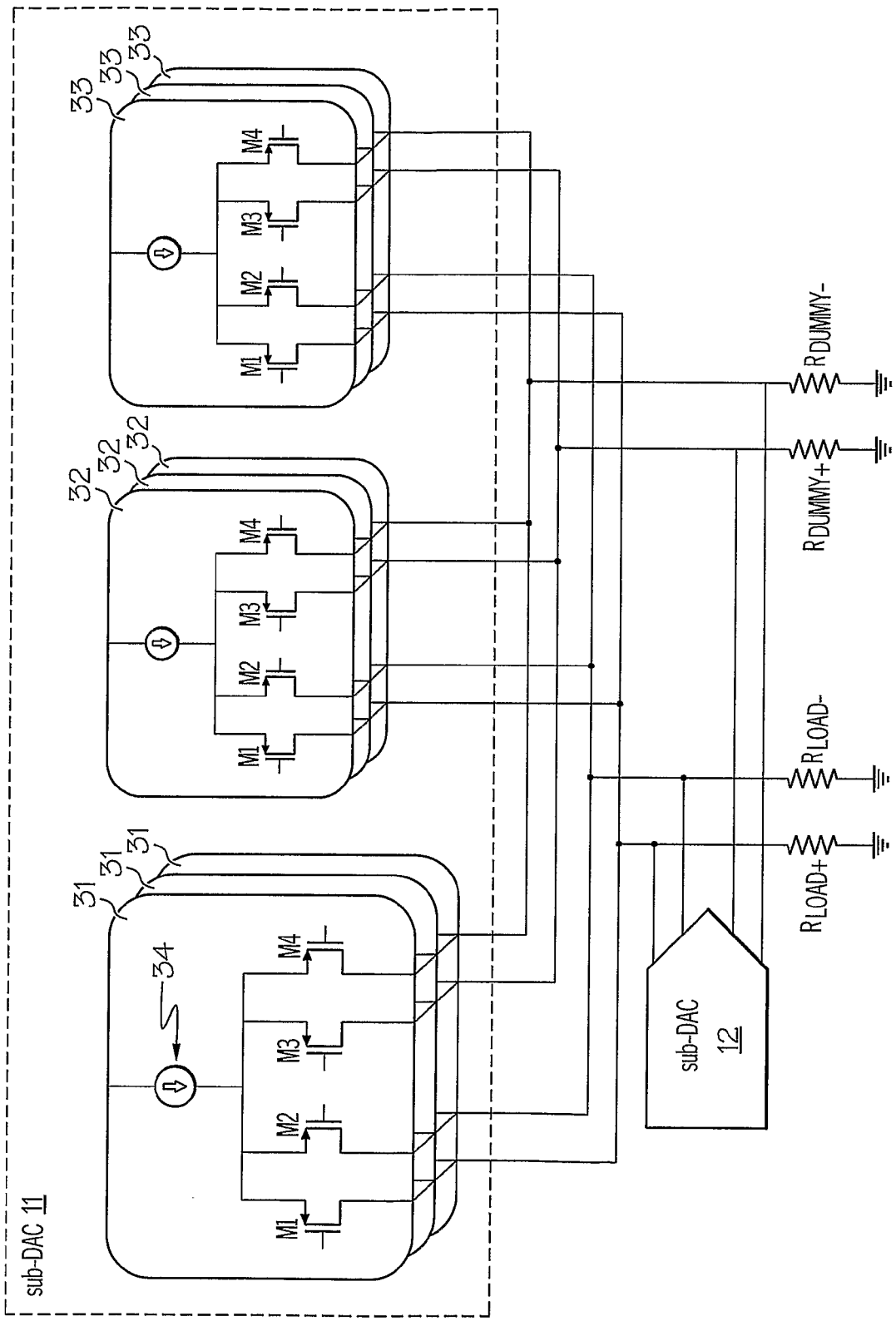
FIG. 3 is a schematic diagram of the output stage of the digital-to-analog converter from FIG. 1, in accordance with a preferred embodiment of the present invention.

Referring now to FIG. 3, there is depicted a schematic diagram of the output stage of DAC 10 from FIG. 1 in differential mode, in accordance with a preferred embodiment of the present invention. Since the output stages of sub-DAC 11 and sub-DAC 12 are substantially identical, only the output stage of sub-DAC 11 is described in details. DAC 10, as shown in FIG. 3, is an n-bit example. Sub-DAC 11 includes a set of $2^p-1$ unary current-steering cells 31 to perform digital-to-analog conversions on the most-significant p bits, a set of $2^q-1$ unary current-steering cells 32 to perform digital-to-analog conversions on the upper least-significant q bits, and a set of r binary current-steering cells 33 to perform digital-to-analog conversions on the least-significant r bits. Each cell within the sets of cells 31-33 includes a current source 34 connected in series with transistors M1-M4 connected in parallel.

Figure 4:
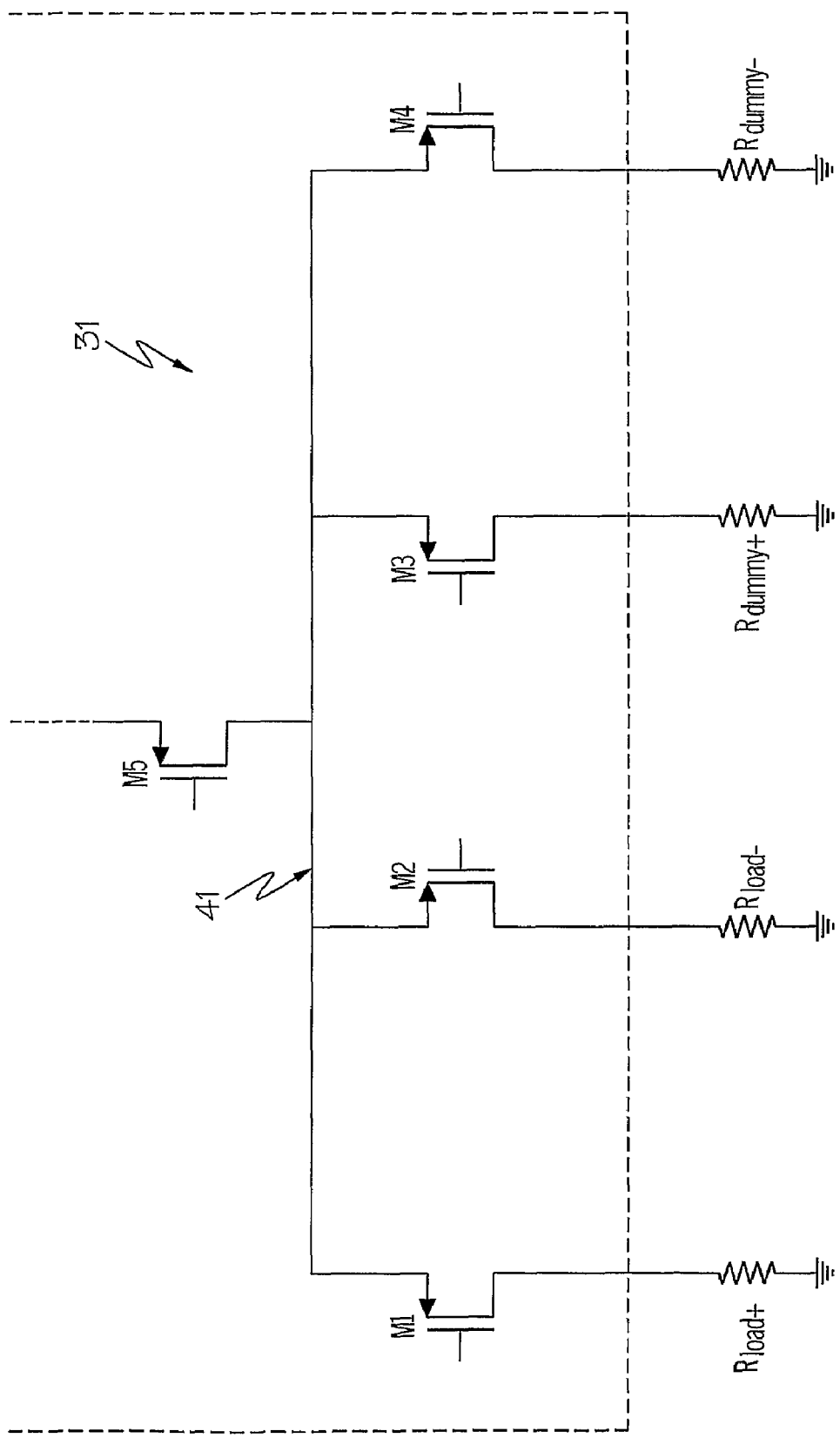
FIG. 4 is a schematic diagram of a current-steering cell within the output stage from FIG. 3, in accordance with a preferred embodiment of the present invention.

With reference now to FIG. 4, there is illustrated a schematic diagram of one of current-steering cells within the set of cells 31 from FIG. 3, in accordance with a preferred embodiment of the present invention. As shown, current-steering cell 31 includes transistors M1-M4 connected in parallel. The sources of transistors M1-M4 are all connected to the drain of a transistor M5 at a common-source node 41. Transistor M5 is a cascode transistor for the current source within current-steering cell 31. Each of the drains of transistors M1-M4 is connected to a respective resistive load. For example, the drain of transistor M1 is connected to load resistor $R_{load+}$, the drain of transistor M2 is connected to load resistor $R_{load-}$, the drain of transistor M3 is connected to a dummy load resistor $R_{dummy+}$, the drain of transistor M4 is connected to dummy load resistor $R_{dummy-}$. Transistors M1-M4 control the steering of the current to one of load resistor $R_{load+}$, load resistor $R_{load-}$, load resistor $R_{dummy+}$, or load resistor $R_{dummy}$.

When DAC 10 (from FIG. 1) operates at a frequency $f_s$ and the outputs of sub-DACs 11 and 12 are time-interleaved, then each of sub-DACs 11 and 12, all operating at $f_s$, has exactly one idle cycle followed by one active cycle. During the idle cycle of each of sub-DACs 11 and 12, a digital-to-analog conversion is performed on a digital input, and the output of, for example, sub-DAC 11 is used to drive the dummy loads (i.e., $R_{dummy+}$ and $R_{dummy-}$), and sub-DAC 12, at the same time, drives the loads (i.e., $R_{load+}$ and $R_{load-}$) with the previous cycle's digital input. At the end of the current cycle, sub-DACs 11 and 12 switch roles.

At the start of sub-DAC 11's idle cycle, the digital input of current-steering cell 31 causes either transistor M3 to steer the current to $R_{dummy+}$ if the input is a logical "1," or transistor M4 to steer the current to $R_{dummy-}$ if the input is a logical "0." This idle cycle pre-charges common source node 41 of transistors M1-M4 to an optimum voltage commensurate with the digital input of sub-DAC 11. During the active cycle, when the current is finally steered towards load resistor $R_{load+}$ for a logical input "1" or $R_{load-}$ for a logical input "0," parasitic capacitors at common source node 41 are already optimally charged, and ideally no signal current is drawn on to further charge or discharge parasitic capacitors at common source node 41; thus, dynamic performance is improved.

As an added advantage of this interleaving technique, at the end of each cycle, exactly two transistors in each current-steering cell are switched: one transistor switching off and one transistor switching on. Such constant switching characteristic is perceived as a desirable property for current-steering DACs because the switching power is then data-independent.

As has been described, the present invention provides a DAC design that allows a current-steering type DAC to concentrate its switching energy at sampling frequency $f_s$, which is caused by the constant switching between a load and a dummy load. As a result, significant improvements in the dynamic linearity can be achieved at the output of the DAC.

While the invention has been particularly shown and described with reference to a preferred embodiment, it will be understood by those skilled in the art that various changes in form and detail may be made therein without departing from the spirit and scope of the invention.

What is claimed is:

1. A digital-to-analog converter (DAC) comprising:
    a first sub-DAC for receiving a first input signal from an input; and
    a second sub-DAC for receiving a second input signal from said input, wherein said second input signal is different from said first input signal, wherein one of said first or second sub-DAC selectively and periodically sends a first output signal to a load while the remaining one of said sub-DACs sends a second output signal to a dummy load, wherein an output of said DAC is provided at said load.

2. The DAC of claim 1, wherein said first and second sub-DACs are current-steering type DACs.

3. The DAC of claim 2, wherein said first and second sub-DACs are substantially identical to each other.

4. The DAC of claim 1, wherein said DAC further includes a first storage element coupled between said first sub-DAC and said input, and a second storage element coupled between said second sub-DAC and said input.

5. The DAC of claim 4, wherein said first and second storage elements are registers.

6. The DAC of claim 5, wherein a sampling frequency at said input equals to an output switching frequency between said first and second sub-DACs.

7. The DAC of claim 6, wherein said registers are clocked at half of said sampling frequency.

8. The DAC of claim 1 wherein said second output signal is different from said first output signal within a clock cycle.

9. The DAC of claim 1, wherein said first sub-DAC receives said first input signal at a different clock cycle from said second sub-DAC receives said second input signal.

10. The DAC of claim 1, wherein said controlling device is a switch.

11. A method for setting internal bias points of a digital-to-analog converter (DAC), said method comprising:
    receiving a first input signal by a first sub-DAC from an input;
    receiving a second input signal by a second sub-DAC from said input, wherein said first input signal is different from said second input signal; and
    selectively and periodically sending an output signal of said first or second sub-DAC to a load while sending an output signal of the remaining one of said sub-DACs to a dummy load, wherein an output of said DAC is provided at said load.

12. The method of claim 11, wherein said first and second sub-DACs are current-steering type DACs.

13. The method of claim 12, wherein said first and second sub-DACs are substantially identical to each other.

14. The method of claim 11, wherein said method further includes coupling a first storage element between said first sub-DAC and said input, and coupling a second storage element between said second sub-DAC and said input.

15. The method of claim 14, wherein said first storage elements are registers.

16. The method of claim 15, wherein said method further includes switching outputs between said first and second sub-DACs at the same frequency as a sampling frequency at said input.

17. The method of claim 16, wherein said method further includes clocking said register at half of said sampling frequency.

18. The method of claim 17, wherein said output signal is different from said first output signal within a clock cycle.

19. The method of claim 11, wherein said first sub-DAC receives said first input signal at a different clock cycle from said second sub-DAC receives said second input signal.

* * * * *